United States Patent
Cox

(10) Patent No.: US 12,046,902 B2
(45) Date of Patent: Jul. 23, 2024

(54) SYSTEM FOR FREQUENCY REGULATION ON A POWER DISTRIBUTION NETWORK

(71) Applicant: ELECTRICITY NORTH WEST PROPERTY LIMITED, Stockport (GB)

(72) Inventor: Steve Cox, Warrington (GB)

(73) Assignee: ELECTRICITY NORTH WEST PROPERTY LIMITED, Warrington (GB)

( * ) Notice: Subject to any disclaimer, the term of this patent is extended or adjusted under 35 U.S.C. 154(b) by 108 days.

(21) Appl. No.: 16/759,256

(22) PCT Filed: Mar. 25, 2019

(86) PCT No.: PCT/EP2019/057450
§ 371 (c)(1),
(2) Date: Apr. 24, 2020

(87) PCT Pub. No.: WO2019/180275
PCT Pub. Date: Sep. 26, 2019

(65) Prior Publication Data
US 2020/0373758 A1     Nov. 26, 2020

(30) Foreign Application Priority Data

Mar. 23, 2018   (EP) ..................................... 18163615
Nov. 27, 2018   (EP) ..................................... 18208639

(51) Int. Cl.
*H02J 3/24*       (2006.01)
*G01R 21/133*     (2006.01)
(Continued)

(52) U.S. Cl.
CPC ............ *H02J 3/241* (2020.01); *G01R 21/133* (2013.01); *H02J 3/12* (2013.01); *H02J 3/1878* (2013.01);
(Continued)

(58) Field of Classification Search
CPC .................................................. H02J 2203/00
See application file for complete search history.

(56) References Cited

U.S. PATENT DOCUMENTS

| | | | |
|---|---|---|---|
| 2011/0196546 A1 | 8/2011 | Muller et al. | |
| 2011/0231028 A1* | 9/2011 | Ozog ..................... | H02J 3/008 700/291 |

(Continued)

FOREIGN PATENT DOCUMENTS

| | | |
|---|---|---|
| JP | 2012526515 A | 10/2012 |
| JP | 2012217332 A | 11/2012 |

(Continued)

OTHER PUBLICATIONS

Written Opinion and International Search Report; PCT/EP2019/057450; mailed Apr. 29, 2019.

(Continued)

*Primary Examiner* — Nathan L Laughlin
(74) *Attorney, Agent, or Firm* — Polsinelli PC

(57) ABSTRACT

System for controlling voltage supply to a portion of a distribution grid. The portion of the grid including a substation providing one or more transformers operable to increase or decrease the voltage supplied to consumers within the portion of the grid. The voltage control system includes: a data set including a previously measured power consumption associated with previously measured values of a property(ies) being one of voltage, current, frequency or load, or a combination thereof, a measuring device to measure the property(ies) within the portion of the grid, a processing device to determine a most likely effect of altering the value(s) of the property(ies) from a first value to a second value, a storage device for storing one or more rules associating a trigger event with a response action associated with the substation, and a control device to receive a (Continued)

Figure 1:
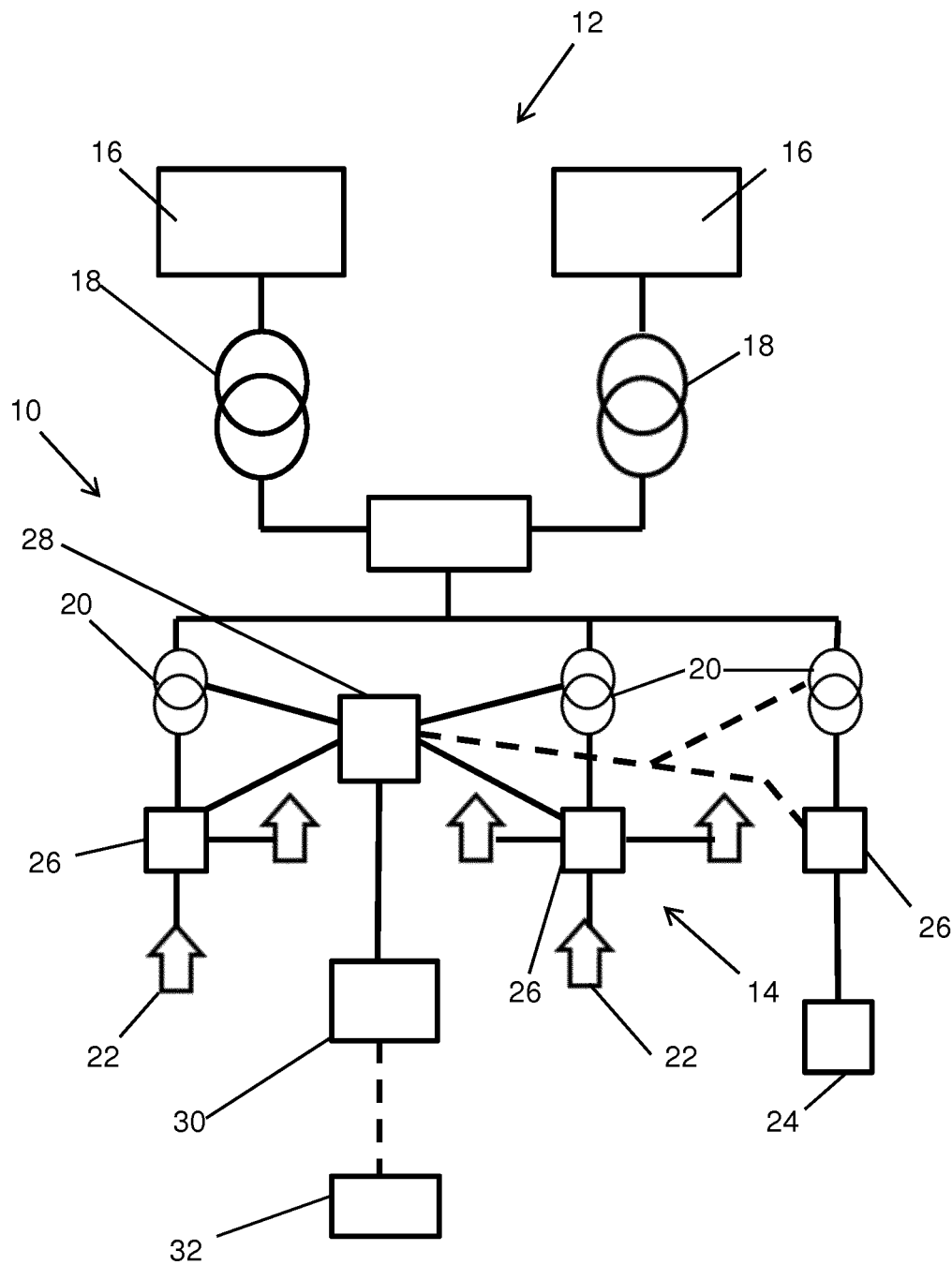

measurement of the property(ies) within the portion of the grid.

19 Claims, 2 Drawing Sheets

(51) Int. Cl.
    *H02J 3/12*           (2006.01)
    *H02J 3/18*           (2006.01)

(52) U.S. Cl.
    CPC ....... *H02J 2203/00* (2020.01); *H02J 2203/20* (2020.01); *H02J 2310/12* (2020.01)

(56) References Cited

U.S. PATENT DOCUMENTS

| | | |
|---|---|---|
| 2011/0251732 A1 | 10/2011 | Schweitzer, III et al. |
| 2012/0022713 A1 | 1/2012 | Deaver et al. |
| 2012/0221163 A1* | 8/2012 | Forbes, Jr. ............. G05B 15/02 700/295 |
| 2012/0249278 A1 | 10/2012 | Krok et al. |
| 2013/0026986 A1* | 1/2013 | Parthasarathy ........... H02J 3/14 320/109 |
| 2014/0172503 A1* | 6/2014 | Hammerstrom ....... G06Q 50/06 705/7.31 |
| 2015/0088330 A1* | 3/2015 | Powell ..................... G05F 1/66 700/297 |
| 2015/0120222 A1* | 4/2015 | Roytelman ....... H02J 13/00002 702/60 |
| 2021/0143637 A1* | 5/2021 | Forbes, Jr. ......... G06Q 30/0201 |

FOREIGN PATENT DOCUMENTS

| | | |
|---|---|---|
| WO | 2010129691 A2 | 2/2010 |
| WO | 2016145062 A1 | 9/2016 |
| WO | 2019180275 A1 | 9/2019 |
| WO | 2010129691 A2 | 11/2020 |

OTHER PUBLICATIONS

English abstract of WO2010012961; retrieved from www.espacenet.com on Apr. 22, 2020.
Australian Government IP Australia Examination Report No. 1 for AU application No. 2019239701, issued on Mar. 3, 2023, 3 pages.
English translation of Japanese Application No. JP2012-526515A, retrieved on May 11, 2023, 13 pages.
English translation of Japanese Application No. JP2012-217332A, retrieved on May 11, 2023, 6 pages.
Japanese Office Action for Japanese Application No. JP2020-524536, issued Apr. 4, 2023, 6 pages.
European Search Report for EP Application No. 18208639.7, issued on Jul. 1, 2019, 8 pages.

* cited by examiner

SYSTEM FOR FREQUENCY REGULATION ON A POWER DISTRIBUTION NETWORK

The present invention relates to a system for and a method of frequency regulation on a power distribution network, and to devices for use in such a system.

An increase in renewable power generation connected to the distribution network has created a more active network where bi-directional power flows are increasingly common. Such renewable generators include but are not limited to wind power generators, solar power generators and tidal generators, for example, provided both in power generation plants and in domestic and commercial premises (i.e. through the installation of solar panels on residential buildings, for example). These active networks present a challenge for traditional methods of voltage regulation which are tailored toward passive, load dominated networks and which aim to maintain constant voltage on the output terminals of transformers.

An expected increase in the demand for electricity, over time, may erode existing network capacity margin at grid and primary substations. When responding to such changes, a distribution network operator (DNO) must assess if the increase is permanent and warrants immediate intervention, or will be eventually offset by distributed generation so that network reinforcement (i.e. provision of additional generators) can be avoided or delayed. In order to operate networks safely in the interim without potentially expensive interventions, techniques have been proposed to enable short-term rapid rises in peak demand to be adequately managed and met using existing assets. These techniques can allow short-term changes in demand to be managed while deferring the acquisition of additional power-generating resources until it is known that capacity is clearly an issue.

It has been demonstrated that electricity network demand (i.e. the total electrical power usage across a network at a given time) can be both reduced and increased by changing the voltage on the public electricity supply network. The operation of primary transformers in a staggered tap configuration can provide a flexible means of absorbing reactive power in a network and controlling over-voltage situations.

In general terms, premises are supplied with electrical power from the network. Electrical devices operating within each those premises require a specific voltage to operate in a fully effective operating state. Slight variations in voltage supplied to the device may affect the operation of the device, but in most cases a very small variation in voltage is not noticeable to the users operating the device. For example, a refrigeration unit or air conditioner operating with a voltage that is supplied within a small margin of error of the specified voltage may not operate at full efficiency, but the difference in operating efficiency is most likely to be largely undetectable. Those devices will still operate as required by the user.

Research and associated field trials examining voltage regulation of active networks reveal that voltage control schemes (Automatic Voltage Control, or AVC) are able to regulate voltages supplied to the network, but that they also act as a constraint on the connection of additional Distributed Generation.

In addition, such systems assist in avoiding unacceptably high voltages on a network, which might otherwise occur on networks during periods when high distributed generation output coincides with low local demand.

There has also been an increasing probability that the available generation within a network may exceed the demand or network capacity, leading to unacceptable network conditions and the need to constrain the generation output. This constraint acts to decrease the efficiency of the generation and hence drive up costs to customers.

Power providers have overseen a change in the types of generator being used to provide power to a network, with increased amounts of low inertia intermittent generation connected to the system along with large nuclear generating units. As a consequence, over time, there will be an increased need to access system reserves to maintain overall system stability to help avoid cascade tripping events. Owing to the high financial and carbon cost of conventional spinning reserve, fast acting and flexible demand management for frequency, and system balancing is expected to become an increasingly important part of future system operation. This is of particular benefit for local power balancing within a DNO network, and also offers potential advantages for future distributed system operator network management.

All alternating current (AC) electricity networks have an inherent system frequency. The frequency is measured in Hertz (Hz) and represents the rotating speed of synchronous electricity generating plant connected to the network. In the United Kingdom the frequency is typically 50 Hz.

As additional demand is connected to a network the frequency reduces. Conversely as the demand falls or additional generation is added to the network, the frequency increases. System frequency must, for technical reasons, be maintained within strict operating limits. Typically the frequency must be maintained within plus or minus of a few percentage points of the nominal or target frequency (i.e. 50 Hz in the UK). For example, in a network with a target frequency of 50 Hz, the electricity must be supplied at a frequency between 49.5 Hz and 50.5 Hz.

Frequency regulation is typically regulated by increasing or decreasing the power output of a generating plant. Of course, as demand on the network grows, at some stage the generation capacity of the network is reached, such that it may not be possible to regulate frequency sufficiently by providing additional power to the network when required. Before this stage is reached, additional power generating capacity must be added to the network, to ensure that frequency on the network can be balanced as required. However, increasing the power output of a generating plant may not be quick or cost-effective to achieve, and relies on the short-term availability of additional power generating facilities.

The present invention seeks to ameliorate or reduce one or more problems associated with systems of the prior art.

Systems described herein relate to developments allowing the automatic regulation of voltage in response to the electricity system frequency. By this method demand is also automatically regulated which in turn counteracts the change in system frequency. Frequency regulation therefore constitutes an advantageous way to stabilise the frequency of the electricity network.

Such systems provide environmental benefits by allowing a mechanism for lowering power consumption, alongside the benefits of reducing the need for additional power generators in circumstances where the frequency and load requirements can be met using the existing infrastructure.

Such systems seek automatically to regulate the demand to counter any change in system frequency thereby maintaining frequency within the prescribed operational limits without the need for additional generating plants. Sensors are used to measure system frequency and then to activate a network transformer on load tap changes to change the network voltage. These voltage changes are co-ordinated through the technology to cause a prescribed and reliable change in system demand and hence stabilise system frequency to the desired value.

According to a first aspect we provide a system for controlling voltage supply to a portion of a distribution grid, the portion of the grid including a substation providing one or more transformers operable to increase or decrease the voltage supplied to consumers within the portion of the grid, the system for controlling voltage supply including:

a data set including a previously measured power consumption associated with previously measured values of (a) property(ies), the property(ies) being one of voltage, current, frequency or load, or a combination thereof, a measuring device to measure the property(ies) within the portion of the grid, a processing device to determine from the previously measured values of the property(ies) in the data set a most likely effect of altering the voltage supplied to consumers within the portion of the grid from a first value to a second value on the power consumption of the consumers within the portion of the grid, a storage device for storing one or more rules associating a trigger event with a response action associated with the substation, wherein the response action includes altering the voltage supplied to consumers within the portion of the grid from the first value to the second value, and a control device configured to receive a measurement of the property(ies) within the portion of the grid to determine whether the measurement matches a trigger event of any one of the rules, and for each triggered rule, to communicate instructions to the substation to perform the response action associated with the triggered rule.

The system may be suitable for controlling voltage supply to multiple portions of a distribution grid each supplied by a respective substation, and the may system include a measuring device associated with each one of the substations, wherein the control device is configured to receive measurements of portions of the grid, and to determine whether the measurements match one or more trigger events and for each triggered rule, to communicate instructions to the corresponding substation associated with the rule to perform the response action associated with the triggered rule.

The trigger events may be thresholds associated with the voltage, current, frequency or power consumption on a portion of the grid.

The trigger events may include an associated time lapse between the trigger event first being observed and the response action being carried out, wherein the response action is only carried out in the trigger event is still triggered after the defined time has lapsed.

The response actions may identify a voltage increase or a voltage decrease associated with a specific substation.

The system may be operable to generate or update rules according to the most likely effect of altering the voltage supplied to consumers within the portion of the grid from a first value to a second value on the power consumption in the or each portion of the grid.

The measuring device may be configured to measure a first voltage supplied at a first time to the consumers within the portion of the grid, and wherein the measuring device may form part of a voltage control device operable to communicate the measured voltage to a network control device acting as the control device, the network control device being operable to determine where the measurement matches any one of the rules and to communicate instructions to the substation either directly or indirectly via the voltage control device.

The measuring device, storage device and control device may be all provided by a voltage control device, the voltage control device being operable to determine where the measurement matches any one of the rules and to communicate instructions to the substation directly in accordance with the response action.

According to a second aspect we provide a method of controlling voltage supplied to a portion of a distribution grid, the method including providing a data set as set forth in any preceding claim, measuring a property, or properties, of the portion of the grid, the property(ies) being one of voltage, current, frequency or load, or a combination thereof, determining from the previously measured values of the property(ies) in the data set a most likely effect of altering the voltage supplied to consumers within the portion of the grid from a first value to a second value on the power consumption in that portion of the distribution grid, storing one or more rules associating a trigger event with a response action associated with the substation, wherein the response action includes altering the voltage supplied to consumers within the portion of the grid from the first value to the second value, determining whether the measurement matches a trigger event of any one of the rules and, for each triggered rule, communicating instructions to the substation within the portion of the grid to perform the response action associated with the triggered rule.

The method may include the step of wherein on determining that a trigger event has occurred, waiting for a time to elapse as specified by the trigger event, and subsequently re-measuring the feature of the portion of the grid that triggered the rule, and communicating instructions to the substation only if the trigger event condition is still met by the later measurement.

The method may further include generating or updating one or more of the rules according to the most likely effect of altering the value of the voltage supplied to consumers within the portion of the grid from a first value to a second value on the power consumption in the or each portion of the grid.

The method may include receiving the rules as an input from a user, and storing those rules.

Figure 2:
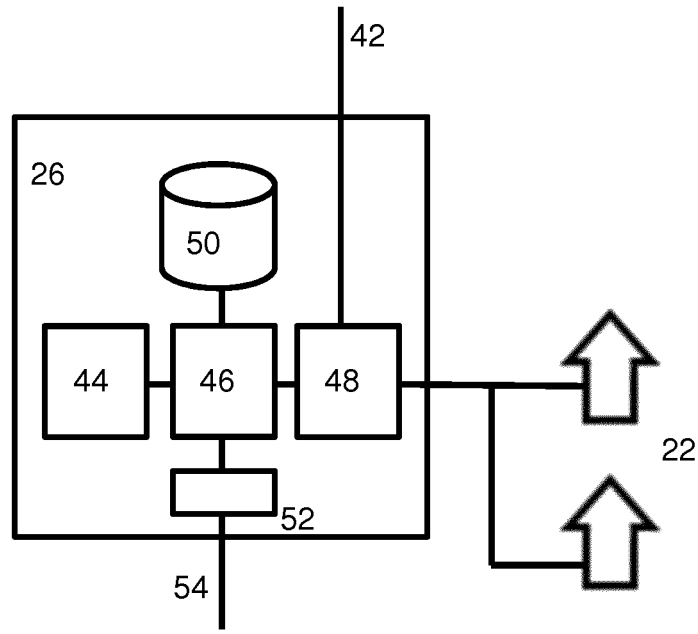
Figure 3:
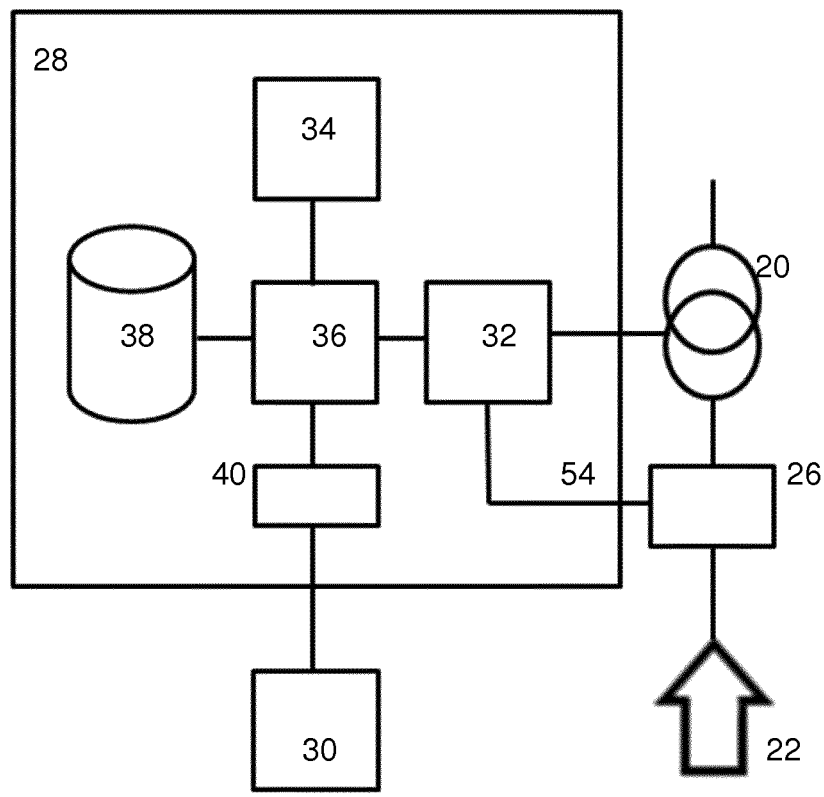

We now describe features of embodiments of the invention, by way of example only, with reference to the accompanying drawings of which FIG. 1 is a diagrammatic representation of a portion of a power grid and system according to aspects of the invention, FIG. 2 is a diagrammatic representation of a voltage control device according to aspects of the invention, and FIG. 3 is a diagrammatic representation of a network control device according to aspects of the invention.

In broad terms, transformers transfer electrical energy between two circuits through electromagnetic induction. As known in the art, a varying magnetic field is produced by varying current in a coil of the transformer, in turn causing a voltage in the second coil. In this way power is transferred between the two coils via the magnetic field. Transformers are deployed at various positions within an electrical power grid 10. For example, transformers 18 are used on the transmission grid 12 in which power generating resources 16

(such as power stations) are located, to convert the electrical supply to a suitable lower voltage for transmission on the distribution grid 14 to consumers. Transformers 20 are also provided at local substations on the grid, to further lower the voltage to a level suitable for consumption in residential, commercial and industrial premises, for example (i.e. 240V in the UK).

In a typical power network the system voltage is regulated by altering the tap position of transformers 18, 20. A tap changer is used to alter the turn ratios on one or both coils of the transformer in discrete steps. A variable turns ratio is enabled by connecting a number of additional taps on either the primary or secondary winding of the transformer 18, 20, to increase or decrease the ratio of turns between the primary and secondary windings. By increasing and decreasing the ratio, the voltage output from the transformer is altered. For example, the default setting of the transformer may convert a high voltage input to a lower voltage output, by providing 80 coils on a primary (i.e. input) winding, and 20 coils on a secondary (i.e. output) winding, to create a drop to 4 to 1 ratio of input to output voltage. By increasing the ratio of coils between the two windings (e.g. by adding tapped coils to the primary winding), the ratio of input to output voltage is increased, resulting in output voltage being decreased. The tap changers can be automated or may be manually operated.

Many substations include a pair of transformers working in parallel. Where illustrated in the figures, a substation 20 is represented by a single transformer 20, but it should be understood that a substation typically provides a pair of transformers working in parallel. Each tap of each transformer 20 changes the voltage by about 1.5%, with a typical tap range of about 20% available on each transformer 20. A pair of transformers 20 feeding 20,000 customers will tap up and down typically between 2-20 times every day during the course of normal operation, to maintain an even output voltage given variation in the input voltage received from the transmission grid 12. The resultant changes to voltage are so small as not to be noticeable by customers.

If a pair of transformers 20 supplying a group of premises are operated at different tap positions, i.e. with "staggered taps", a circulating current is introduced around the pair. The circulating current decreases the network power factor and effectively absorbs reactive power from the upstream distribution grid 12. The consequential increase in reactive demand reduces network voltages higher up in the grid but leaves customer voltages unaffected. This technique is highly effective in controlling potential unacceptable high voltages.

This paired arrangement for transformers 20 can also be used to deliver a very fast demand response which can automatically balance a network in the event of loss of a large generation in feed. For example, if one of the pair of transformers 20 is disconnected, supplies are still maintained to all premises in the group by the second transformer 20 but the voltage supplied to the group will instantaneously reduce by between 4-8% triggering a similar instantaneous demand reduction in the group. When aggregated across many substations, this response is sufficiently large to counteract the loss of a major power generator 16. The system of the present invention allows a response of this nature to be delivered in a coordinated and controlled manner.

A significant drop in demand (of 20-40%, for example) may be enabled under certain conditions—such as when all available sources of reserve generation have been exhausted and the only option available to balance the system is to reduce demand. Demand reduction can be achieved either through voltage reduction or direct disconnection of loads. A voltage reduction of a 3% typically provides a 5% demand reduction and a 6% voltage reduction provides a 10% demand reduction. To meet these demand reduction requirements, a 1.5% voltage change from transformer tap operation delivers a predictable and controlled demand response which when aggregated at a point in a network is adequate for demand management, whether locally or on a wider national grid whilst at the same time not impacting on the quality of supply to customers.

With reference to FIG. 1 of the drawings, the distribution grid 12 is connected via substations 20 that provide transformers (in pairs, as described above) for converting the transmitted voltages to lower voltages for supply to consumers 22, for example. In general terms, the power is supplied locally to consumers at premises such as residential, commercial or industrial units, for example. A single substation 20 may supply power to a single or to multiple consumers 22. In a residential neighbourhood, for example, a substation may provide power to hundreds, or thousands, of properties. In the case of residential premises, the consumers 22 draw a relatively small amount of power each—in the order of a few kW. However, the power consumed within each subsection of the grid served by a substation 20, varies constantly. While the consumption follows certain general patterns, there is no certain method of predicting how much power will be required at a specific time or over a future time period, and therefore the load placed on the substation 20 cannot be known accurately in advance.

In broad terms, a system is provided for controlling voltage supply to portions of the distribution grid. Each portion can be thought of as providing a respective substation 20, having one or more transformers operable to increase or decrease the voltage supplied to consumers within that portion of the grid. In general terms, a voltage control system measures a first voltage supplied at a first time to the consumers within the portion of the grid. The system also measures (or calculates based on other readings) an estimate of the load being used by the consumers at that point in time—in other words, how much electricity is being consumed. Using this data, the voltage control system determines an estimate of the effect, of altering the voltage supplied to those consumers from the supplied voltage to a revised voltage, on the power consumption of those consumers. In other words, if the voltage to that portion of the grid is reduced, what is the corresponding drop in power usage likely to be as a result of that voltage reduction? Similarly, if the voltage rises, what effect is that likely to have. Such variations in power consumption effect the frequency of the grid, and therefore having knowledge of the effect of such rises and reductions prior to making them, provides important information used to manage the grid and react to fluctuations in frequency.

The voltage control devices 26 form part of a voltage control system which may include multiple voltage control devices 26 each being associated with a respective substation 20 and set of consumers 22. One or more network control devices 28 also form part of the voltage control system, the network control devices 28 being configured to communicate with the voltage control devices 26, to receive data from those devices, and to determine ways in which to regulate frequency on the grid by controlling the respective substations 20.

Each voltage control device 26 may provide a relay 48, for example, to disconnect the consumers 22 from the powered network in the event of a fault occurring, by activating a circuit breaker to trip the powered connection.

In embodiments, and particularly in residential and commercial settings, a single voltage control device 26 may connect one or more premises to the substation 20, and preferably, the voltage control device 26 provides a power connection between the substation 20 and a plurality of consumers 22. In industrial settings, or for single consumers creating large power consumption (such as a hospital, for example), a single voltage control device 26 may connect a substation 20 to what is effectively a single consumer 22.

Each consumer 22 may use a plurality of powered devices, each drawing electrical load from the network. For example, residential properties may include tens or even hundreds of devices requiring electrical power. Factories or commercial premises may provide tens or hundreds of power-consuming units 24 such as air conditioning systems, refrigeration systems, storage heaters, or the like.

FIGS. 2 and 3 illustrate a voltage control device 26 and a network control device 28 according to embodiments of the invention. The voltage control device 26 includes a measuring device 44 operable to measure the voltage of the electricity supplied (see input line 42) to its respective consumers 22. The measuring device 44 or a further measuring device is also operable to measure or calculate the load drawn on the network by the consumers 22 forming its subsection of the network. The or another measuring device 44 may be operable to measure the frequency of the network.

In embodiments the voltage control device 26 includes a processor 46 for controlling operation of the device, the processor 46 being connected to a data storage device 50 (either internal to the device or via a data link to a remote device or cloud resource, for example). The storage device 50 may be used to store operating instructions to configure the processor 46 to operate the relay 48 when certain operating conditions are detected. For example, the relay 48 may be tripped in the event that an over-voltage is detected by the measuring device 44.

The measurements of voltage and/or current made by the voltage control devices 26 are communicated to the network control device 28, and received via a network communication interface 32. The measurements may also be stored locally on the storage device 50. The voltage control devices 26 provide a communications interface 52 for sending data to and receiving data from the network control device 28 via a communication channel 54. The communication channel 54 may be provided by a direct wired link or via a wired or wireless network, via internet protocol (e.g. via a cloud-based server), or by any other suitable means of communication as is known in the art. The network control device 28 provides a respective communication interface 32 for sending and receiving data to and from the voltage control devices 26 and/or substations 20.

Further, the processor 46 may be configured to communicate with the respective substation 20 supplying power to the voltage control device 26 and its respective consumers 22.

In embodiments the network control device 28 further provides a dashboard functionality—in other words, providing an interface for a user to oversee and/or control the operation of the various distributed voltage control devices across the network, and/or to control the transformers operating at the various substations 20 on the network. The terms network control device 28 and dashboard are used interchangeably herein.

The network control device 28 provides a processor 36, operable to control and configure the voltage control devices 26 and transformers at local substations 20 on the network, via the communications interface 32. The network control device 28 further provides a network storage device 38 for storing operating data and/or operating instructions and settings. The network storage device 38 may be formed integrally with the network control device 28 or may be hosted elsewhere on the network or on cloud-hosted remote storage, for example. In such cases, the storage device 38 may be accessible via the communications interface 32.

In embodiments, the network control device 28 may itself provide a measuring device 34 for measuring aspects of network operating conditions, such as voltage, current or frequency conditions in a part of the network.

In embodiments, the voltage control device 26 is operable to send instructions to the substation 20 to cause increase or to decrease the ratio of windings on the primary and secondary coils of the transformer(s) at that substation, in response to conditions detected on that respective subsection of the network. The voltage control device 26 may, for example, detect that the voltage supplied to the consumers 22 is too low, and require that the transformer(s) reduce the tapping on the primary coil (or increase the tapping on the secondary coil) to increase the voltage supplied. The substation 20 may be controlled in such a way that one of the transformers ceases to operate, so that only one of the pair of transformers is operational. In doing so, the load on the operational transformer is increased, which impacts the voltage output by the transformer—and thus the voltage supplied to that portion of the network.

The network control device 28 further provides a control interface 40 for connection to a grid management system 30, which is operable to oversee grid operations and performance. The grid management system 30 is operable to provide feedback of operating conditions to users operating and overseeing the grid network, via a user interface 32. The user interface may be hosted locally at the network control device 28 or via a network connection on a remote terminal, or via a web-based portal hosted on a server for example.

Primarily the network control device 28 is operable to receive data transmitted from the voltage control devices 26, indicating details of the voltage of the electricity supplied from its associated local substation 20. The information received may include one or more measurements of voltage, current drawn by the consumers 22 on that portion of the grid, the operating current conditions, and frequency. In this way the voltage control system is able to use the information of the voltage being supplied to the portion of the grid, and the operating conditions on that respective portion of that grid including the load being drawn, to estimate the effect (in terms of change of power consumption at least, from which a corresponding change in frequency may be inferred) of changing the voltage before any such change is made. The voltage control system then communicates instructions to the substation 20 to alter the voltage supplied to the consumers 22 within the portion of the grid to the revised voltage.

The transformer(s) of the substation 20 typically provide tap changers as described above, operable to increase or reduce the windings on one or both of the primary and/or secondary winding of the transformer so as to alter the voltage output from the transformer to the consumers within the portion of the grid. The instructions to alter the voltage are sent either by the network control device 28 directly to the substation 20, or from the network control device 28 via the voltage control device 26 associated with that substation 20.

In embodiments, the network control device 28 is programmed to carry out automated responses to situations arising on the network, either locally at subsections of the network served by particular substations 20 and/or voltage control devices 26, or at a network-level, where the responses of multiple voltage control devices 26 and/or substations 20 on the network are controlled centrally to achieve a particular grid-level response.

In embodiments, the network control device 28 is configured to determine a suitable change in voltage to apply, where a frequency event or the like is detected, indicating that a change in voltage is required. For example, with a sudden peak in frequency, the network control device 28 may determine that a drop in voltage is required to reduce the power consumed in a portion of the grid. Alternatively, a user of the system (via the dashboard and user interface 32) may review a potential voltage drop prior to putting it into effect, to determine its likely outcome. The network control devices 28 may either select a candidate voltage from a predefined set of voltages saved on the storage device 38, or may calculate a candidate voltage based on the data readings (i.e. present voltage, load on the portion of the grid, and optionally frequency on the grid or frequency response to be achieved). In embodiments, a plurality of different voltages may be considered, each providing a different change in power consumption, and associated frequency response. The estimates of the change in consumption are displayed to a user, or are calculated and reviewed by the network control device 28, so that a preferred candidate may be selected as the revised voltage to be used. Instructions are then sent accordingly, and in the case where user input is required, confirmation is requested prior to the instructions being sent.

Of course, the network control device 28 receives information from a plurality of voltage control devices 26 across the grid, and is operable to select between different portions of the grid before making a choice of which substation needs remedial action. The system may compare the estimated effects of altering the voltages provided to different portions of the grid, each being subject to different loads, and potentially having different frequency response characteristics. In this way, a system operator may compare the effects of applying voltage changes to different portions of the grid, to make an educated assessment of which substation transformers to operate (i.e. to change the voltage supplied).

Having assessed the relative properties of various portions of the grid, the network control device 28 (and over-arching grid management system 30) is operable to store information regarding the properties associated with particular substations 20 and their respective voltage control devices 26. In general, the estimated effect of changing the voltage at various portions of the grid follows a general pattern, in that there is a strong correlation between the consumers served by the substation and the size of load drawn. It is likely that a portion serving 20,000 consumers, all being residential, has a different drawn load than a substation serving an industrial estate comprising 20 factories. The patterns of load drawn on each substation over a 24 hour period will be very different, with peak demand at different times, and with different levels of fluctuation. The effect of a voltage drop of 2% on each portion, for example, is likely to result in a different drop in power consumption, and correspondingly different frequency response.

If demand/load on the grid is greater than the generating capacity of the network, frequency falls, while an excess of capacity results in frequency rising. According to embodiments of the invention, the voltage control system determines and stores a set of rules associating trigger events with associated responses. For example if the frequency on the grid falls below a certain threshold value, one or more specified substation transformers on the grid should reduce their output voltage by a predetermined amount. Therefore, in this way, if the load on the grid is too high, resulting in a fall in frequency, the voltage control system automatically selects certain transformers at which the voltage output should be reduced, to rectify or at least lessen the problem.

In embodiments, the network control device(s) 28 store data representing a set of rules for triggering an increase or a decrease in voltage output from one or more substations on the grid. The rules associate the measured frequency on the grid falling below a threshold, or rising above a threshold, with a set of actions to be taken. Each action identifies a substation and a required rise of fall in voltage, or a set of actions to be taken at that substation to achieve the rise or fall in voltage (e.g. tripping one of the transformers, or tapping or untapping coils from one of the primary or secondary windings of the transformer).

In this way, when a voltage control device 26 measures a voltage, or frequency, or measures or calculates a load on the associated portion of the network, and communicates that data to the network control device 28, the network control device compares the received data to one or more stored rules. If one or more of the rules is matched by the data received (i.e. the data indicates that a threshold has been breached, or that the data is in a specified range), then the network control device 28 communicates instructions corresponding to the triggered rule to the specified devices. The devices may be substations 20, or may be voltage control devices 26 associated with those substations 20. In this way, the voltage response is achieved at one or more substations 20 around the grid, as specified by the triggered rules.

In other embodiments, or in addition to the above, the rules and corresponding actions may be stored at individual voltage control devices 26. In that case, a voltage control device 26 may take a reading of the voltage and load on its own associated portion of the grid, and if the readings indicate that a rule has been triggered (e.g. the load, frequency or voltage has exceeded a target threshold) then the voltage control device 26 communicates an instruction to the substation 20 to change its output voltage according to the stored rule.

The rules implemented across the grid may create a staggered response to a frequency event (i.e. observed high or low frequency reading). The rules may stipulate a time delay between a threshold being exceeded and the response change in voltage being applied, or may require readings to exceed a threshold for a set time period before action is taken. In this way, responses at given portions of the network (and their associated substations) is delayed.

A first response to a failure of a power station, for example, may be made when the high or low frequency is first identified. In such a scenario, the resulting drop in frequency is likely to be accentuated and require a quick response. The first response may be made at a substation 20 which is likely to provide the single greatest fall in power consumption for a given fall in voltage, for example, to provide the largest possible immediate rectification without creating an excessive voltage drop. Further responses may then be triggered after predetermined time delays, so that further substations 20 apply reductions in voltage if the frequency is still determined to be outside of a given range, or threshold, after a predetermined period. In that case those further substations 20 apply voltage reductions according to the stored rules, leading to a return in balance in the frequency on the grid.

This technique can also be applied to manage the power consumption across the grid. In embodiments, the rules stipulate changes to the voltages supplied by the respective substations 20 subject to the estimated power demand in that respective portion of the grid exceeding pre-determined ranges or thresholds. For example, if the power demand is estimated to rise above a certain level in a portion of the grid, the voltage control device 26 associated with that portion may apply a rule that stipulates reducing the voltage supplied by its associated substation 20 by 0.5V where the power consumption is estimated to be above level X. In response to the level rising above X, the voltage control device 26 communicates instructions to its associated substation 20, requiring a reduction in voltage of 0.5V. The substation 20 adjusts its transformers accordingly, resulting in the specific voltage reduction.

The voltage control device 26 continues to monitor the voltage on the portion of the grid and continues to estimate the power demand in that portion. As the power demand falls below a certain level, another rule triggers a restoration of the original voltage level, prompting the voltage control device 26 to communicate with the substation 20 to effect that change.

In this way power demand across the grid may be managed by systems according to the present invention.

The rules stored at different voltage control devices 26 across the grid may differ. The rules stored at voltage control devices 26 may be received from network control devices 28 and or grid management systems 30, for storage at the respective devices. Updated rules may be received periodically or on demand, or may be installed at the network control device 28 or voltage control devices 26 via an internet connection or from a cloud-based service, for example.

In embodiments, the system may include a data set which includes a previously measured power consumption which is associated with a previously measured value, or measured values, of a property, or properties. This property, or properties, may be one of voltage, current, frequency or load, or a combination thereof. This property, or properties, is measured by the measuring device as described above. The data set may be stored at the storage device 50 (that storing trigger event information), or may be stored on a further storage device associated with the system. Alternatively, the data set may be stored in the cloud for remote access by the system.

Using such a data set has been found to be advantageous in predicting responses in large networks, and in particular in portions of the grid including a combination of constant power and constant impedance loads. Examples of loads in such a portion of the grid are motor controllers, generators and other power loads/sources that respond substantially independently to either counteract or amplify the change in power consumption. Previously systems have relied on formula driven models (i.e. theoretical models), such as described in US2011/0251732, which produce the same response for a given set of inputs (since the formula provides one outcome for a defined set of inputs). Often these models are provided with tuneable parameters to try and match the formula driven model as closely as possible to the portion of the grid which the model is modelling. Furthermore, such models are bound by a finite and usually small set of parameters, providing a theoretical prediction of power output response. In contrast, by using a data set which includes previously measured power consumptions, and/or changes in power consumptions, associated with property(ies), and/or changes in property(ies), of the portion of the grid, or the consumers, and other factors having an input on power consumption, it is possible to predict reliably how the power consumption of the portion of the power grid, or the consumers, will change for a given change in the property(ies). In other words, rather than making a theoretical prediction based on a fixed set of parameters, the system bases its estimation of change in power consumption (i.e. the most likely effect of altering the value(s) of the property(ies)) on recorded observations of similar scenarios or identical scenarios in relation to the network, or a network under similar or identical conditions or experiencing similar or identical changes in conditions. In embodiments, in this way, the system provides adaptive behaviour so that its response differs according to observations or past behaviour and the results of that behaviour.

As described above the system may include a processor, or processing device. In embodiments including the data set the processing device may determine from the previously measured values of the property(ies) in the data set a most likely effect of altering the value(s) of the property(ies) from a first value to a second value on the power consumption of those consumers.

The processing device may be configured to determine whether the power consumption of the consumers has reached a desired value. This may be advantageous in ensuring the portion of the grid is drawing the amount of power that is expected.

The measured value of the property, or values of the properties, and the measured power consumption may be added to the data set. This may be advantageous as it provides more data in the data set for the processing device to interrogate in determining the most likely effect of altering the value(s) of the property(ies) from a first value to a second value on the power consumption of those consumers.

The data set may include measurements of the property, or properties, and the measured power consumption which have been taken every: 60 minutes; 50 minutes; 40 minutes; 30 minutes; 20 minutes; 15 minutes; 10 minutes; 5 minutes; 4 minutes; 3 minutes; 2 minutes; or 1 minute. This is advantageous as this improves the accuracy of the data set and thus the accuracy of the most likely effect of altering the value of the property, or values of the properties, on the power consumption of consumers.

The data set may include the day on which the property(ies) and power consumption were measured, for example, Monday, Tuesday, Wednesday, Thursday, Friday, Saturday or Sunday. The day on which the property(ies) and power consumption were measured may be used to assist in determining the most likely effect of altering the value of the property(ies) on the power consumption of consumers.

The data set may include property(ies) and power consumption values measured over a period of time of at least: 1 year; 2 years; 3 years; 4 years; 5 years; 6 years; 7 years; 10 years; 15 years; or 20 years. This may be advantageous in providing a robust data set which improves the accuracy of the data set and thus the accuracy of the most likely effect of altering the value of the property, or values of the properties, on the power consumption of consumers.

The data set may include seasonal information associated with the measured property(ies) and measured power consumption. For instance the data set may include whether the measurements were made in winter, spring, summer or autumn. The data set may also include whether the measurements were made on a public holiday. The seasonal information may then be used to assist in determining the most likely effect of altering the value of the property(ies) on the power consumption of consumers.

The data set may include environmental information associated with the measured property(ies) and measured power consumption. For instance, the data set may include the temperature at the time the measurements were made. The data set may include the weather at the time the measurements were made. This may be advantageous because it may enable a closer match between presently measured property(ies) and previously measured property(ies) which may in turn provide a more accurate determination of the most likely effect of altering the value of the property(ies) from a first value to a second value on the power consumption of consumers.

The data set may include the number of windings on the primary and/or secondary windings of the transformer when the measurements were made. This may be advantageous as this improves the accuracy of the data set and thus the accuracy of the most likely effect of altering the value of the property, or values of the properties, on the power consumption of consumers.

The most likely effect of altering the value of the property(ies) from a first value to a second value on the power consumption of those consumers may be determined by using one or more of the following: numerical regression; k-means clustering; multivariate analysis; a neural network; Bayes' theorem. This may be advantageous as this improves the ability of the system to interrogate the data set. This in turn improves the system ability to determine the most suitable previous measurements on which to base the most likely effect of altering the value of the property, or values of the properties, on the power consumption of consumers.

The storage device may store one or more rules associating a trigger event with a response action associated with the substation. In embodiments, the response action may include altering the property, or properties, from the first value to the second value as determined by the processing device.

While example embodiments of the invention are described herein, it should be understood that features of different embodiments may be combined with one another, in isolation from one another or in any combination, unless stated otherwise.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

The invention claimed is:

1. A system for controlling voltage supply to a portion of a distribution grid, the portion of the grid including a substation including one or more transformers operable to increase or decrease the voltage supplied to consumers within the portion of the grid, the system for controlling voltage supply including:
a data set including a previously measured power consumption associated with previously measured values of a plurality of properties, the plurality of properties being power consumption and one of voltage, current, frequency or load, or a combination thereof,
a measuring device to measure the plurality of properties within the portion of the grid,
a processing device operable to control the substation, the processing device operable to determine from the previously measured values of the plurality of properties in the data set a most likely effect of altering the voltage supplied to consumers at the one or more transformers within the portion of the grid from a first value to a second value on the power consumption of the consumers within the portion of the grid,
a storage device for storing one or more rules associating a trigger event with a response action associated with the substation,
wherein the response action includes altering the voltage supplied to consumers within the portion of the grid from the first value to the second value, and
a control device operable to control the distribution grid, the control device in communication with the processing device, the control device configured to receive, from the substation, a measurement of at least one of the plurality of properties within the portion of the grid to determine whether the measurement matches a trigger event of any one of the rules, and for each triggered rule, to automatically communicate instructions to the processing device of the substation to perform the response action associated with the triggered rule.

2. A system according to claim 1, for controlling voltage supply to multiple portions of a distribution grid each supplied by a respective substation, the system including a measuring device associated with each one of the substations,
wherein the control device is configured to receive measurements of portions of the grid, and to determine whether the measurements match one or more trigger events and for each triggered rule, to communicate instructions to the corresponding substation associated with the rule to perform the response action associated with the triggered rule.

3. A system according to claim 1, wherein the trigger events are thresholds associated with the voltage, current, frequency or power consumption on a portion of the grid.

4. A system according to claim 1, wherein the trigger events include associated time lapse between the trigger event first being observed and the response action being carried out, wherein the response action is only carried out in the trigger event is still triggered after the defined time has lapsed.

5. A system according to claim 1, wherein the response actions identify a voltage increase or a voltage decrease associated with a specific substation.

6. A system according to claim 1, wherein the system is operable to generate or update rules according to the most likely effect of altering the voltage supplied to consumers within the portion of the grid from a first value to a second value on the power consumption in the or each portion of the grid.

7. A system according to claim 1, wherein the measuring device is configured to measure a first voltage supplied at a first time to the consumers within the portion of the grid, and wherein the measuring device forms part of a voltage control device operable to communicate the measured voltage to a network control device acting as the control device, the network control device being operable to determine where the measurement matches any one of the rules and to communicate instructions to the substation either directly or indirectly via the voltage control device.

8. A system according to claim 1, wherein the measuring device, storage device and control device are all provided by a voltage control device, the voltage control device being operable to determine where the measurement matches any one of the rules and to communicate instructions to the substation directly in accordance with the response action.

9. The system according to claim 1, wherein the most likely effect of altering the voltage supplied to consumers at the one or more transformers is based upon recorded observations of similar scenarios or identical scenarios in relation to a network coupled to the grid.

10. The system according to claim 1, wherein the most likely effect of altering the voltage supplied to consumers at the one or more transformers is based upon a network coupled to another grid under similar or identical conditions.

11. The system according to claim 1, wherein most likely effect of altering the voltage supplied to consumers at the one or more transformers is based upon a network coupled to another grid experiencing similar or identical changes in conditions.

12. The system according to claim 1, wherein the trigger event includes an associated time lapse between the trigger event first being observed and the response action being carried out, wherein the response action is only carried out in the trigger event is still triggered after the defined time has lapsed.

13. The system according to claim 1, wherein the control device is operable to receive and store information regarding one or more properties associated with each of a plurality of substations, wherein the control device is operable to determine which particular substation of the plurality of substations to transmit the instructions to perform the response action.

14. A method of controlling voltage supplied to a portion of a distribution grid, the method including
providing a data set as set forth in claim 1,
measuring a plurality of properties, of the portion of the grid, the plurality of properties being power consumption and one of voltage, current, frequency or load, or a combination thereof,
determining, by a processing device operable to control the substation from the previously measured values of the plurality of properties in the data set a most likely effect of altering the voltage supplied to consumers at one or more transformers within the portion of the grid from a first value to a second value on the power consumption in that portion of the distribution grid,
storing one of more rules associating a trigger event with a response action associated with the substation,
wherein the response action includes altering the voltage supplied to consumers within the portion of the grid from the first value to the second value,
determining, by a control device operable to control the distribution grid and in communication with the processing device, whether the measurement matches a trigger event of any one of the rules and, for each triggered rule,
communicating, automatically by the control device, instructions to the processing device of the substation within the portion of the grid to perform the response action associated with the triggered rule.

15. A method according to claim 14, wherein on determining that a trigger event has occurred, waiting for a time to elapse as specified by the trigger event, and subsequently re-measuring the feature of the portion of the grid that triggered the rule, and communicating instructions to the substation only if the trigger event condition is still met by the later measurement.

16. A method according to claim 14, further including generating or updating one or more of the rules according to the most likely effect of altering the voltage supplied to consumers within the portion of the grid from a first value to a second value on the power consumption in the or each portion of the grid.

17. A method according to claim 15 including receiving the rules as an input from a user, and storing those rules.

18. The method of claim 14, wherein the trigger event includes an associated time lapse between the trigger event first being observed and the response action being carried out, wherein the response action is only carried out in the trigger event is still triggered after the defined time has lapsed.

19. The method of claim 14, wherein the communicating instructions to the substation further includes:
receiving and storing, by the control device, information regarding one or more properties associated with each of a plurality of substations;
determining, by the control device which particular substation of the plurality of substations to transmit the instructions to perform the response action.

\* \* \* \* \*